United States Patent
Terada et al.

(10) Patent No.: US 7,757,625 B2
(45) Date of Patent: Jul. 20, 2010

(54) METHOD FOR FORMING THIN FILM AND FILM-FORMING DEVICE

(75) Inventors: Shouichi Terada, Koshi (JP); Tsuyoshi Mizuno, Koshi (JP); Takeshi Uehara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 843 days.

(21) Appl. No.: 11/585,860

(22) Filed: Oct. 25, 2006

(65) Prior Publication Data

US 2007/0098901 A1 May 3, 2007

(30) Foreign Application Priority Data

Oct. 27, 2005 (JP) .............................. 2005-312212

(51) Int. Cl.
*B05C 5/02* (2006.01)

(52) U.S. Cl. .................... 118/52; 118/319; 118/320; 118/50; 118/729

(58) Field of Classification Search .................. 118/52, 118/56, 319, 320, 50, 729; 396/611; 427/421.1, 427/424, 425, 427.2, 427.3
See application file for complete search history.

(56) References Cited

U.S. PATENT DOCUMENTS

| 2001/0003964 A1* | 6/2001 | Kitano et al. | 118/50 |
| 2003/0205196 A1* | 11/2003 | Kitano et al. | 118/319 |
| 2005/0098906 A1* | 5/2005 | Satoh et al. | 261/19 |

FOREIGN PATENT DOCUMENTS

| JP | 07-047324 | 2/1995 |
| JP | 11-329938 | 11/1999 |

* cited by examiner

*Primary Examiner*—Laura Edwards
(74) *Attorney, Agent, or Firm*—Smith, Gambrell & Russell, LLP

(57) ABSTRACT

It is an object to provide a method for forming a thin film which can be uniformly and precisely planarized without a high-loaded process as in a chemical mechanical polishing method and to provide a device used for the method. In a method for forming a thin film on a surface of a-semiconductor wafer as a substrate to be processed by supplying a coating solution to the wafer having asperities on the surface thereof, a thin film of a coating solution is planarized by placing the wafer having the thin film formed on the surface thereof in a solvent gas atmosphere generated in a treatment chamber, then spraying a solvent gas toward the surface of the wafer from a solvent-gas-supplying nozzle and, simultaneously, relatively moving the wafer and/or the solvent-gas-supplying nozzle in directions parallel to each other.

5 Claims, 6 Drawing Sheets

METHOD FOR FORMING THIN FILM AND FILM-FORMING DEVICE

BACKGROUND OF THE INVENTION

1. Field of the Invention

The present invention relates to a method for forming a thin film and a film-forming device. More specifically, the present invention relates to a method for forming a thin film on a surface of a substrate by supplying a coating solution to the substrate such as a semiconductor wafer or a liquid crystal display (LCD) wafer, and further relates to a film-forming device used for the method.

2. Description of the Background Art

In the related art, technologies for manufacturing multilayer wiring boards have been employed in line with the development of highly integrated semiconductor devices. In a multilayer wiring structure, silicon oxide films, so-called spin-on-glass (SOG) films, are used as insulating films for insulating wiring, i.e., circuit patterns, from each other in the multilayer wiring boards.

The SOG films are generally formed by spin coating, namely, by applying a coating solution comprising a glass component dissolved in an organic solvent onto a substrate, and then calcining the coated solution by thermal treatment such as drying, baking, or curing to form a film.

A substrate surface has asperities due to circuit patterns formed on the substrate. Therefore, in known spin coating and thermal drying, a film is formed so as to trace the asperities and the film has unevenness in the surface shape. This disturbs later processes. For example, when lithography is carried out in a later process, deterioration in line width (CD) is caused by a difference in depth of focus. In addition, the unevenness of the surface increases with the number of laminated films. Thus, various problems arise.

Consequently, planarization of thin films is necessary. As a method for planarizing a thin film, a chemical mechanical polishing (CMP) method is known. The CMP method is conducted by hardening a thin film on a substrate by thermal treatment and then removing a part of the thin film by pressing a polishing member against the thin film. The polishing member is prepared by dropping a polishing solution containing mechanical polishing abrasive and chemical polishing abrasive to the surface of a polishing pad.

Another method (device) for planarizing a film is known (see, for example, Japanese Patent Laying-Open No. 07-047324). This method does not require a high-loaded process as in the CMP method. The method is conducted by supplying a coating solution to a substrate surface with asperities, thinly spreading the coating solution over the surface of the substrate by using a scanner plate to form a thin film, and, simultaneously, uniformly pressing the film by means of air pressure from a slit-shaped nozzle.

According to another method (device), a thin film is formed by supplying a coating solution onto the surface of a substrate and then supplying a gas containing solvent vapor to uniformly reduce the thickness of the film (for example, Japanese Patent Laying-Open No. 11-329938).

However, in the former method, namely, the technology disclosed in Japanese Patent Laying-Open No. 07-047324, since the air is blown toward the coating solution, the solution vaporizes to be hardened. Consequently, the fluidity of the coating solution is decreased causing insufficient uniformity of the thin film.

In the latter method, namely, the technology disclosed in Japanese Patent Laying-Open No. 11-329938, since the solvent vapor is supplied to the coating solution, the vaporization of the coating solution is avoided compared with the former method. However, the thin film is hardened by vaporization due to influence of the surrounding circumstances of a treatment place, as in the former method. Consequently, the fluidity is decreased. Thus, this method also cannot sufficiently achieve uniformity of the thin film.

SUMMARY OF THE INVENTION

The present invention has been accomplished in view of the aforementioned circumstances. An object of the present invention is to provide a method for forming a uniformly and precisely planarized thin film without a high-loaded process as in the CMP method. Another object of the present invention is to provide a device used in the method.

In order to solve the above-mentioned problems, an aspect of the present invention provides a method for forming a thin film on a substrate having asperities on a surface thereof by supplying a coating solution to the surface of the substrate. The method includes the steps of placing a substrate having a thin film of a coating solution formed thereon in a solvent gas atmosphere; and planarizing the thin film of the coating solution by spraying the solvent gas aspirated from the solvent gas atmosphere to the surface of the substrate from a solvent-gas-supplying nozzle and, simultaneously, relatively moving the substrate and/or the solvent-gas-supplying nozzle in directions parallel to each other.

Preferably, the pressure of the solvent gas atmosphere is maintained at a level equal to or higher than the saturated vapor pressure level of the solvent gas.

Another aspect of the present invention provides a method for forming a thin film including the steps of forming a thin film on a surface of a substrate by supplying a coating solution to the substrate having asperities on the surface thereof; feeding the substrate having the thin film formed thereon into a treatment chamber shielded from the air; forming a solvent gas atmosphere inside the treatment chamber by supplying a solvent gas into the treatment chamber; and spraying the solvent gas aspirated from the solvent gas atmosphere to the surface of the substrate from a solvent-gas-supplying nozzle and, simultaneously, relatively moving the solvent-gas-supplying nozzle and/or the substrate in directions parallel to each other.

Furthermore, another aspect of the present invention provides a method for forming a thin film including the steps of forming a thin film on a surface of a substrate received in a treatment chamber shielded from the air by supplying a coating solution to the substrate having asperities on the surface thereof; forming a solvent gas atmosphere inside the treatment chamber by supplying a solvent gas into the treatment chamber; and spraying the solvent gas aspirated from the solvent gas atmosphere to the surface of the substrate from a solvent-gas-supplying nozzle and, simultaneously, relatively moving the solvent-gas-supplying nozzle and/or the substrate in directions parallel to each other.

Preferably, the step for relatively moving the substrate and/or the solvent-gas-supplying nozzle in directions parallel to each other is conducted one or more times. More preferably, the step for relatively moving the substrate and/or the solvent-gas-supplying nozzle in directions parallel to each other is conducted at least twice, and the distance between the substrate and the solvent-gas-supplying nozzle is gradually increased in the step repeated two or more times compared with the initial distance.

Preferably, the method further includes the step of maintaining the pressure in the treatment chamber at a level equal to or higher than the saturated vapor pressure level of the solvent gas.

Preferably, the solvent gas contains the solvent of the coating solution.

Furthermore, another aspect of the present invention provides a film-forming device for forming a thin film on a substrate having asperities on a surface thereof by supplying a coating solution to the surface of the substrate. The device includes a treatment chamber for receiving a substrate having a thin film of a coating solution formed thereon and shielding the substrate from the air; a holding portion for holding the substrate and being disposed in the treatment chamber; a solvent-gas-supplying portion for supplying a solvent gas into the treatment chamber; a pressure-regulating portion for controlling pressure in the treatment chamber; a solvent-gas-supplying nozzle for spraying the solvent gas toward the surface of the substrate; and a moving portion for relatively moving the holding portion and/or the solvent-gas-supplying nozzle in directions parallel to each other.

A film-forming device for forming a thin film according to another aspect of the present invention includes a rotating and holding portion for horizontally and rotatably holding a substrate; a coating-solution-supplying nozzle for supplying a coating solution to the substrate held by the rotating and holding portion; a treatment chamber for receiving the substrate having a thin film of a coating solution on the surface thereof and shielding the substrate from the air; a holding portion for holding the substrate and being disposed in the treatment chamber; a solvent-gas-supplying portion for supplying a solvent gas into the treatment chamber; a pressure-regulating portion for controlling pressure in the treatment chamber; a solvent-gas-supplying nozzle for spraying the solvent gas toward the surface of the substrate; and a moving portion for relatively moving the holding portion and/or the solvent-gas-supplying nozzle in directions parallel to each other.

A film-forming device for forming a thin film according to another aspect of the present invention includes a treatment chamber for receiving a substrate and shielding the substrate from the air; a holding portion for horizontally and rotatably holding the substrate and being disposed in the treatment chamber; a coating-solution-supplying nozzle for supplying a coating solution to the substrate held by the holding portion; a solvent-gas-supplying portion for supplying a solvent gas into the treatment chamber; a pressure-regulating portion for controlling pressure in the treatment chamber; a solvent-gas-supplying nozzle for spraying the solvent gas toward the surface of the substrate; and a moving portion for relatively moving the holding portion and/or the solvent-gas-supplying nozzle in directions parallel to each other.

Preferably, the moving portion is constituted so as to relatively move the holding portion and/or the solvent-gas-supplying nozzle in directions parallel to each other one or more times; and the solvent-gas-supplying nozzle is constituted so as to be able to change the distance from the substrate and to gradually increase the distance from the substrate in the step repeated two or more times compared with the initial distance.

Preferably, the film-forming device further includes a pressure gauge for detecting pressure in the treatment chamber; and a controlling portion for controlling the pressure-regulating portion according to a detection signal from the pressure gauge.

According to the present invention, a thin film can be planarized in a state that a coating solution is not volatilized and thereby is not hardened and the viscosity of the coating solution is maintained by placing a substrate having a thin film of the coating solution formed thereon in a solvent gas atmosphere; and spraying the solvent gas toward the surface of the substrate from a solvent-gas-supplying nozzle in the solvent gas atmosphere and, simultaneously, relatively moving the substrate and/or the solvent-gas-supplying nozzle in directions parallel to each other.

Furthermore, a thin film can be planarized in a state that a coating solution is not volatilized and thereby is not hardened and the viscosity of the coating solution is maintained by supplying the coating solution to a substrate to form a thin film; placing the substrate in a solvent gas atmosphere; and spraying the solvent gas toward the surface of the substrate from a solvent-gas-supplying nozzle in the solvent gas atmosphere and, simultaneously, relatively moving the substrate and/or the solvent-gas-supplying nozzle in directions parallel to each other.

Furthermore, a thin film can be planarized in a state that a coating solution is not volatilized and thereby is not hardened and the viscosity of the coating solution is maintained by supplying the coating solution to a substrate received in a treatment chamber shielded from the air to form a thin film on a surface of the substrate; then forming a solvent gas atmosphere inside the treatment chamber by supplying a solvent gas into the treatment chamber; and spraying the solvent gas toward the surface of the substrate from a solvent-gas-supplying nozzle in the solvent gas atmosphere and, simultaneously, relatively moving the substrate and/or the solvent-gas-supplying nozzle in directions parallel to each other.

A thin film of a coating solution can be planarized by spraying a solvent gas to the thin film while reciprocatedly and relatively moving the substrate and/or the solvent-gas-supplying nozzle in directions parallel to each other. On this occasion, when the step for reciprocatedly moving the solvent-gas-supplying nozzle and/or the substrate is conducted more than once, the thin film can be virtually planarized in the first scanning, and the asperities on the surface of the thin film can be further evened out in the second and later scanning by gradually increasing the distance between the substrate and the solvent-gas-supplying nozzle in the scanning repeated two or more times compared with the initial distance.

The drying of the coating solution can be suppressed by maintaining the pressure of the solvent gas atmosphere at a level equal to or higher than the saturated vapor pressure level of the solvent gas.

Furthermore, change in the quality of the coating solution can be suppressed by using a solvent gas containing the solvent of the coating solution.

The present invention is constituted as in above to achieve the following effects:

(1) Since a thin film can be planarized in a state that a coating solution is not volatilized and thereby is not hardened and the viscosity of the coating solution is maintained, the thin film can be uniformly and precisely formed.

(2) A thin film is formed by supplying a coating solution to a substrate and then the thin film of the coating solution can be planarized in a state that the coating solution is not volatilized and thereby is not hardened and the viscosity of the coating solution is maintained. Therefore, the film-forming treatment can be rapidly performed, in addition to the effects described in the above (1).

(3) Since the film-forming treatment can be conducted in a state that a substrate is placed in a treatment chamber which is shielded from the air as when a coating solution is supplied, the film-forming treatment can be further rapidly performed and a film-forming device can be miniaturized, in addition to the effects described in the above (1) and (2).

(4) Since a thin film of a coating solution can be planarized by spraying a solvent gas to the thin film while reciprocately and relatively moving the substrate and/or the solvent-gas-supplying nozzle in directions parallel to each other, the thin film can be further uniformly and precisely formed, in addition to the effects described in the above (1) to (3). In addition, when the step for reciprocatedly moving the solvent-gas-supplying nozzle and/or the substrate is conducted more than once, the distance between the substrate and the solvent-gas-supplying nozzle in the scanning repeated two or more times is gradually increased compared with the initial distance. Consequently, the thin film can be virtually planarized in the first scanning, and, though the blow strength of the solvent gas against the thin film is decreased, the asperities on the surface of the thin film can be further evened out in the second and later scanning. Thus, the uniformity of the thin film can be further improved.

(5) Since the drying of the coating solution can be suppressed by maintaining the pressure of the solvent gas atmosphere at a level equal to or higher than the saturated vapor pressure level of the solvent gas, the thin film can be further uniformly and precisely formed, in addition to the effects described in the above (1) to (4). In addition, the reliability of the film-forming device can be improved.

(6) Since change in the quality of the coating solution can be suppressed by using a solvent gas containing the solvent of the coating solution, the thin film can be further uniformly and precisely formed, in addition to the effects described in the above (1) to (5), and the reliability of the film-forming device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of the present invention will now be described in detail with reference to the appended drawings. Here, an example that a film-forming device according to the present invention is applied to a device used for forming a SOG film on a semiconductor wafer will be described.

First Embodiment

Figure 1:
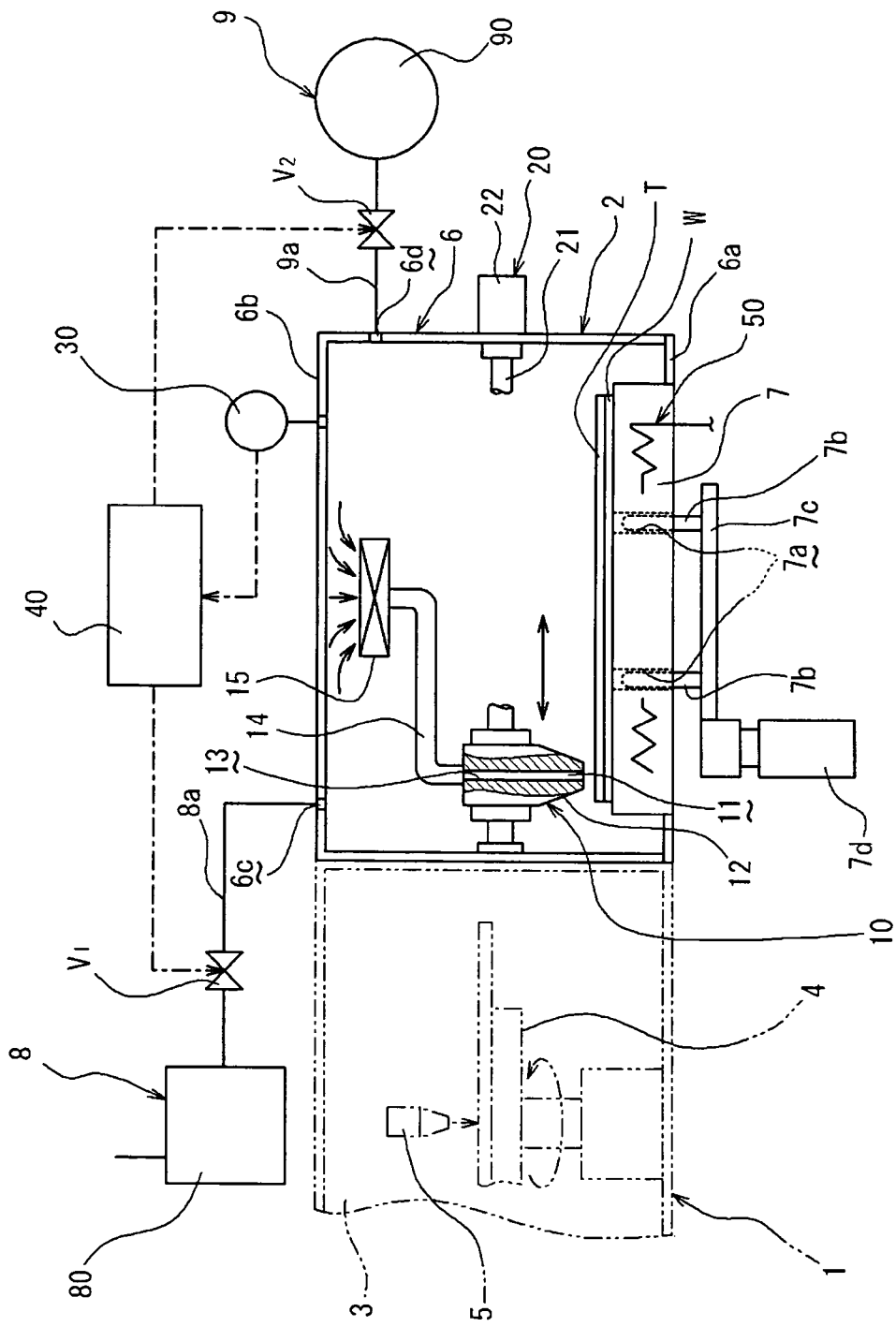
FIG. 1 is a schematic cross-sectional view of a film-forming device according to a First Embodiment of the present invention.

FIG. 1 is a schematic cross-sectional view of a film-forming device according to a First Embodiment of the present invention.

The film-forming device is provided with a coating unit 1 and a film-forming unit 2. In the coating unit 1, a thin film of a coating solution, namely, an SOG solution such as a polysilazane solution, is formed on a semiconductor wafer W (hereinafter referred to as wafer W) which is a substrate with asperities to be processed. In the film-forming unit 2, the thin film formed on the wafer W is planarized.

The coating unit 1 is provided with a coating chamber 3, a spin chuck 4, and a coating-solution-supplying nozzle 5. The coating chamber 3 receives a wafer W conveyed by a conveying arm (not shown). The spin chuck 4 is disposed in the coating chamber 3 and serves as a holding and rotating portion for holding and horizontally rotating the wafer W. The coating-solution-supplying nozzle 5 drops (supplies) a coating solution, for example, an SOG solution, on the surface of the wafer W.

In the coating unit 1 constituted as described above, a thin film of a coating solution is formed on the surface of a wafer W by dropping the coating solution from the coating-solution-supplying nozzle 5 on the surface of the wafer W received in the coating chamber 3 and by rotating the spin chuck 4.

The film-forming unit 2 is mainly composed of a treatment chamber 6, a loading plate 7, a solvent-gas-supplying portion 8, a pressure-regulating portion 9, a solvent-gas-supplying nozzle 10, and a moving portion 20. The treatment chamber 6 receives a wafer W having a thin film formed thereon and shields the film from the air. The loading plate 7 is disposed in the treatment chamber 6 and serves as a holding portion for holding a wafer W. The solvent-gas-supplying portion 8 supplies a solvent gas into the treatment chamber 6. The pressure-regulating portion 9 controls the pressure in the treatment chamber 6. The solvent-gas-supplying nozzle 10 sprays a solvent gas, for example, butyl ether used as a solvent of SOG, toward the surface of the wafer W. The moving portion 20 relatively moves the solvent-gas-supplying nozzle 10 and/or the loading plate 7 in directions parallel to each other. In addition, the film-forming unit 2 is provided with a pressure gauge 30 and a pressure controller 40. The pressure gauge 30 detects pressure in the treatment chamber 6. The pressure controller 40 controls the pressure-regulating portion 9 according to a detection signal from the pressure gauge 30.

In this case, the treatment chamber 6 is constituted by a fixing base 6a for mounting the loading plate 7 thereon and a box-shaped lid 6b which can be opened by being moved up and down with respect to the fixing base 6a. The lid 6b is moved by a lifting and lowering portion (not shown). Alternately, the treatment chamber 6 may have a structure including an opening provided on a side wall for taking a wafer W in and out and a shutter for allowing the opening to be opened and closed, instead of the fixing base 6a and the movable lid 6b.

The loading plate 7 is constituted so as to be able to adsorptively hold a wafer W. In addition, the loading plate 7 is concentrically provided with through-holes 7a, for example, three through-holes 7a. Supporting pins 7b passing through the through-holes 7a are held by holding member 7c and are driven by a supporting-pin-rising cylinder 7d so as to extrude from the surface of the loading plate 7.

The loading plate 7 is provided with a temperature-controlling portion 50 for controlling the temperature of a wafer W held on the loading plate 7 to a predetermined level, for example, the range of 15 to 23° C.

By controlling the temperature of the wafer W to a lower level by using the temperature-controlling portion 50, a favorable film can be formed. In other words, the boiling point of a solvent is decreased and the volatilization of the solvent is accelerated by reducing pressure. When the solvent volatilizes rapidly, a film to be formed is significantly influenced by the volatilization, resulting in surface roughness. Therefore, in order to form a favorable film, the temperature of the wafer W is decreased to deduce the volatilization rate of the solvent.

The solvent-gas-supplying portion 8 is composed of a vaporizer 80 having a function for generating a solvent gas. The vaporizer 80 is connected to a supply inlet 6c provided at an end side of the lid 6b of the treatment chamber 6 via a supply pipe 8a. That is, one end of the supply pipe 8a is connected to the vaporizer 80 and the other end is connected to the supply inlet 6c. The supply pipe 8a is provided with an on-off valve V1 between both ends thereof The on-off valve V1 is opened or closed according to a control signal from the pressure controller 40. A solvent gas is supplied into the treatment chamber 6, for example, at a rate of 1 g/min by the solvent-gas-supplying portion 8.

The pressure-regulating portion 9 is constituted by a vacuum pump 90, an on-off valve V2, and a pressure gauge 30. The vacuum pump 90 is connected to an exhaust outlet 6d via an exhaust pipe 9a. The exhaust outlet 6d is provided to the lid 6b of the treatment chamber 6 at an end side other than the end side where the supply inlet 6c is disposed. The on-off valve V2 is disposed between both ends of the exhaust pipe 9a and is opened or closed according to a control signal from the pressure controller 40. The on-off valve V2 may be, for example, a butterfly valve. The pressure gauge 30 detects pressure in the treatment chamber 6 and sends the data as a detection signal to the pressure controller 40. The pressure in the treatment chamber 6 is adjusted by the thus constituted pressure-regulating portion 9 to a predetermined level, i.e., to a pressure level higher than the saturated vapor pressure level of a solvent.

The solvent-gas-supplying nozzle 10 is provided with a nozzle head 12 having a slit-shaped nozzle orifice 11. The size of the nozzle orifice 11 is slightly longer than the diameter of the wafer W. In addition, the nozzle orifice 11 is communicated with a communicating passage 13 which is connected to a blower 15 via a gas-supplying pipe 14. The gas-supplying pipe 14 has elasticity and flexibility. The solvent-gas-supplying nozzle 10 is constituted to spray a solvent gas supplied into the treatment chamber 6 toward the surface of a wafer W by driving the blower 15.

Figure 2A:
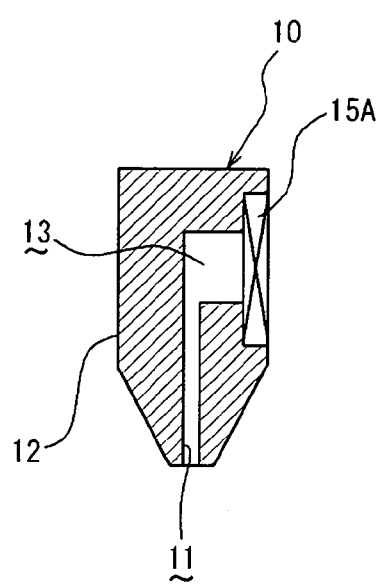
FIG. 2A is a schematic cross-sectional view of a solvent-gas-supplying nozzle according to the present invention.
Figure 2B:
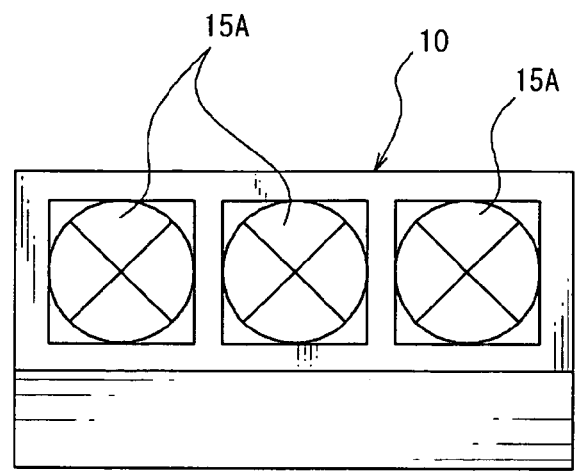
FIG. 2B is a side view of the solvent-gas-supplying nozzle according to the present invention.

In the above-described example, the solvent-gas-supplying nozzle 10 and the blower 15 are connected via the gas-supplying pipe 14. Alternately, as shown in FIGS. 2A and 2B, a blower 15A may be mounted directly on the nozzle head 12 of the gas-supplying pipe 14.

The nozzle head 12 of the solvent-gas-supplying nozzle 10 is driven by the moving portion 20 and is reciprocatedly and relatively moved in a direction parallel to the loading plate 7. In this example, the moving portion 20 is a ball screw mechanism consisting of a ball screw axis 21 and a driving motor 22. The ball screw axis 21 is laterally bridged by the lid 6b of the treatment chamber 6. The driving motor 22 rotates the ball screw axis 21 in both forward and reverse directions. The nozzle head 12 is slidably fit to the ball screw axis 21 of the ball screw mechanism and a guiding axis (not shown) disposed to be parallel to the ball screw axis 21. Therefore, the solvent-gas-supplying nozzle 10 can be reciprocatedly moved in a direction parallel to the wafer W placed on the loading plate 7 by rotating the driving motor 22 of the ball screw mechanism in both forward and reverse directions. The moving portion 20 may be a linear driving mechanism or a belt-driven mechanism using a timing belt or pulley, instead of the ball screw mechanism.

In the above-described example, the solvent-gas-supplying nozzle 10 is driven by the moving portion 20 so as to be moved in a direction parallel to the loading plate 7. Alternately, the solvent-gas-supplying nozzle 10 is fixed and the loading plate 7 may be moved in a direction parallel to the solvent-gas-supplying nozzle 10, or both the solvent-gas-supplying nozzle 10 and the loading plate 7 may be moved in directions parallel to each other.

Figure 3A:
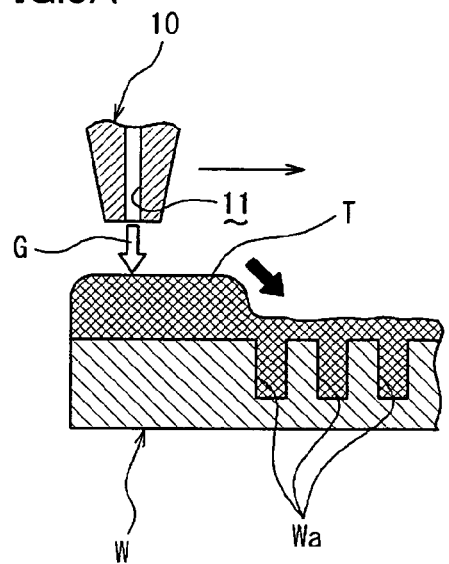
FIG. 3A is an enlarged cross-section showing a state where a solvent gas is sprayed from the solvent-gas-supplying nozzle to planarize a thin film.
Figure 3B:
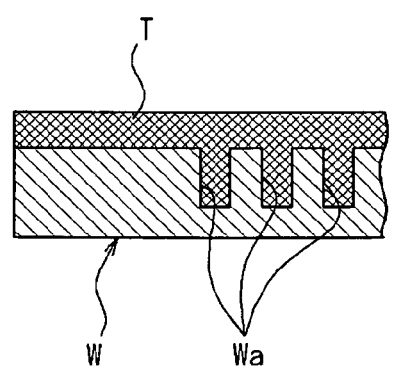
FIG. 3B is an enlarged cross-sectional view of a planarized thin film.
Figure 4:
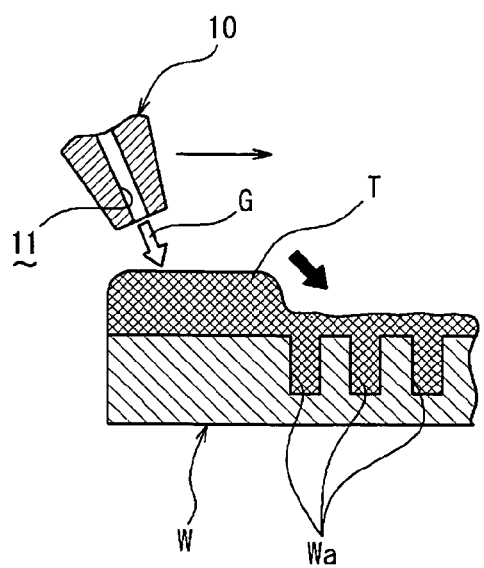
FIG. 4 is an enlarged cross-section showing a state where a thin film is planarized by being sprayed with a solvent gas from the solvent-gas-supplying nozzle in a slant direction.

With the solvent-gas-supplying nozzle 10 having the above-mentioned configuration, as shown in FIG. 3A, a solvent gas G is sprayed from the solvent-gas-supplying nozzle 10 toward a wafer W having a thin film T of a coating solution formed thereon. At the same time, the solvent-gas-supplying nozzle 10 is relatively moved in a direction parallel to the wafer W (scanning the wafer W) so that the surface of the thin film T is pressed by means of pressure of the solvent gas G. As a result, the coating solution forming the thin film T at a portion where the thin film T is thick flows to a portion where the thin film T is thin due to concaves Wa on the wafer W. Thus, the surface of the thin film T is planarized (See FIG. 3B). In such a case, as shown in FIG. 4, the nozzle orifice 11 of the solvent-gas-supplying nozzle 10 may be slanted in the direction in which the solvent-gas-supplying nozzle 10 is moved. The coating solution forming the thin film T at a thick part of the thin film T can smoothly flow toward a thin part by slanting the nozzle orifice 11 of the solvent-gas-supplying nozzle 10 in the direction in which the solvent-gas-supplying nozzle 10 is moved.

Figure 5:
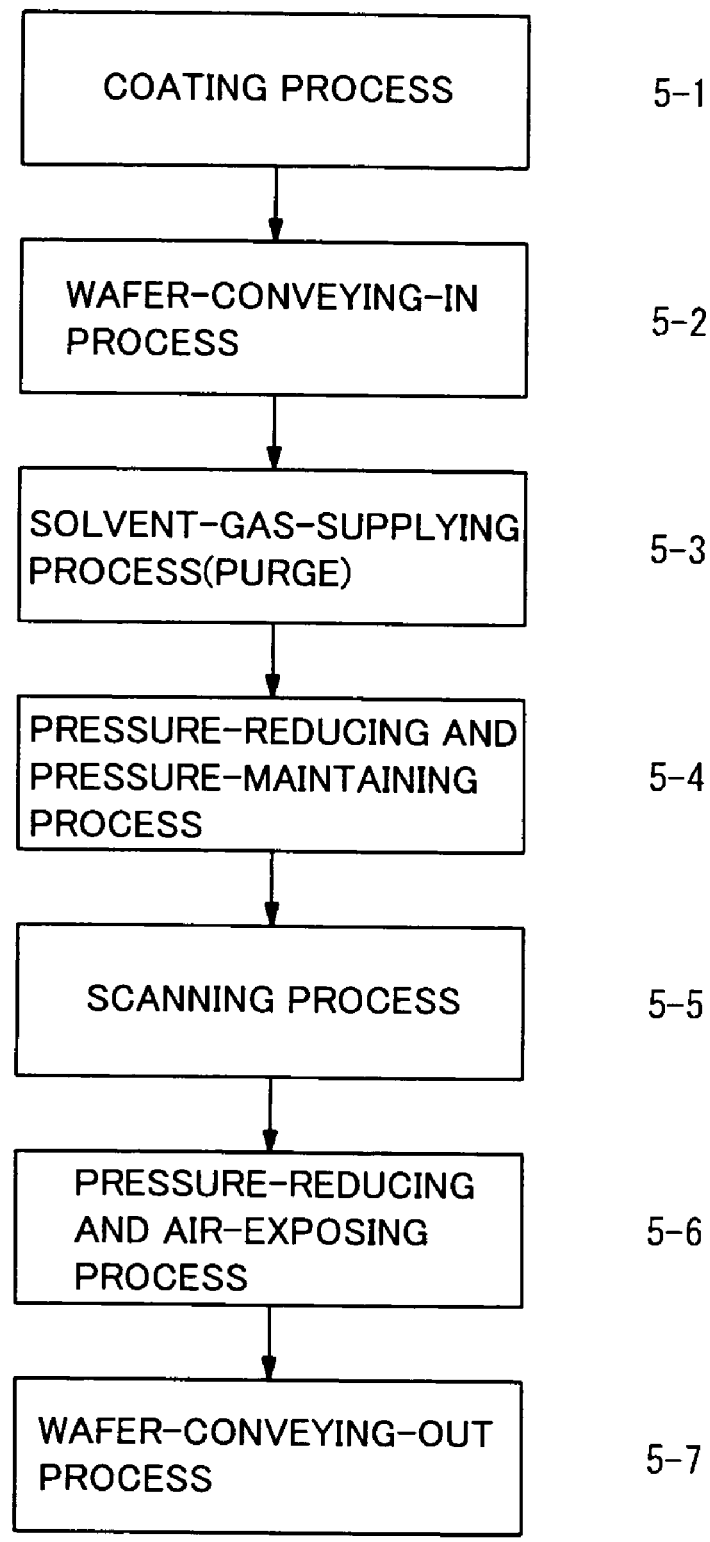
FIG. 5 is a flow chart showing the operation of the film-forming device according to the First Embodiment of the present invention.

The operation of the film-forming device having the above-mentioned configuration will now be described with reference to the drawings of FIGS. 1, 3A, and 3B and the flow chart of FIG. 5.

A wafer W to be processed is fed to the coating unit 1 by a conveying arm (not shown) and is transferred to the spin chuck 4. The coating-solution-supplying nozzle 5 drops a coating solution onto the surface of the wafer W. The spin chuck 4 is rotated to form a thin film of the coating solution on the surface of the wafer W (Step 5-1: Coating process).

Then, the wafer W having the thin film formed thereon is transferred to a conveying arm (not shown) and is fed to the treatment chamber 6 of the film-forming unit 2 (Step 5-2: Wafer-conveying-in process). On this occasion, the lid 6b provided to the treatment chamber 6 moves up, and the wafer W is placed on the loading plate 7. Then, the lid 6b moves down to shield the treatment chamber 6, which has received the wafer W on the loading plate 7, from the air. The on-off valve V1 of the solvent-gas-supplying portion 8 is opened according to a control signal from the pressure controller 40 and, thereby, a solvent gas generated by the vaporizer 80 is supplied (purge) to the treatment chamber 6 (Step 5-3: Solvent-gas-supplying process). The pressure in the treatment chamber 6, which is changed by the supply (purge) of the solvent gas, is detected by the pressure gauge 30. When the pressure in the treatment chamber 6 exceeds a predetermined level, the on-off valve V2 is opened by a predetermined opening degree according to a control signal from the pressure controller 40 to decrease the pressure in the treatment chamber 6. The pressure in the treatment chamber 6 is maintained at a level suitable for film-forming treatment, for example, at a pressure of 450 Pa when the treatment is conducted once, or at 400 Pa when the treatment is conducted twice (Step 5-4: Pressure-decreasing and Pressure-maintaining process). On this occasion, the pressure in the treatment chamber 6 must be adjusted to a level at least equal to or higher than the saturated vapor pressure level of a solvent, for example, to a pressure of 350 Pa or more. If the pressure in the treatment chamber 6 is lower than the saturated vapor pressure of a solvent, the thin film is dried and the planarization cannot be sufficiently achieved.

In a state that the inside of the treatment chamber 6 is in a solvent gas atmosphere at a predetermined pressure, the solvent-gas-supplying nozzle 10 is relatively moved in a direction parallel to the wafer W held by the loading plate 7. At the same time, as shown in FIGS. 3A and 3B, a solvent gas is sprayed from the solvent-gas-supplying nozzle 10 to the surface of the wafer W, for example, at a flow rate of 0.5 m$^3$/min for planarizing the thin film T formed on the wafer W (Step 5-5: Scanning process). In this scanning process, the solvent-gas-supplying nozzle 10 is moved (scan) from a position corresponding to one end of the wafer W to a position corresponding to the other end of the wafer W (1 time treatment), or the solvent-gas-supplying nozzle 10 is reciprocatedly moved (scan) from the position corresponding to one end of the wafer W to the position corresponding to the other end of the wafer W and then back to the original position (2 times treatment). The scanning rate is 1 mm/sec, for example.

The thin film on the surface of the wafer W is planarized in the scanning process, and then the on-off valve V1 is closed. The pressure in the treatment chamber 6 is decreased to, for example, 50 Pa by controlling the opening degree of the on-off valve V2 of the pressure-regulating portion 9, and then the treatment chamber 6 is exposed to the air (Step 5-6: Pressure-reducing and air-exposing process). Then, the supporting pins 7b move upward to lift the wafer W to the upper side of the loading plate 7 after the release (ascending) of the lid 6b or along with the ascending of the lid 6b. In this state, a conveying arm (not shown) receives the wafer W and takes the wafer W out (Step 5-7: Wafer-conveying-out process).

In the above-described example, the solvent-gas-supplying nozzle 10 is reciprocatedly moved (scan) only once, but the solvent-gas-supplying nozzle 10 may scan the wafer W several times. In such a case, the solvent-gas-supplying nozzle 10 is configured so that the distance between the solvent-gas-supplying nozzle 10 and the wafer W, namely, the height of the solvent-gas-supplying nozzle 10 is changeable. For example, the solvent-gas-supplying nozzle 10 is constituted so as to be movable in the vertical direction by a vertically moving mechanism (not shown). The distance (height) between the solvent-gas-supplying nozzle 10 and the liquid surface (wafer W) is adjusted to, for example, 0.5 mm in a first scanning, 1.5 mm in a second scanning, and 3 mm in a third scanning. Thus, the distance (height) between the solvent-gas-supplying nozzle 10 and the wafer W is gradually increased (enlarged) in the scanning repeated two or more times compared with the distance in the first scanning. Consequently, the thin film can be virtually planarized in the first scanning, and, though the blow strength of the solvent gas against the thin film is decreased, the asperities on the surface of the thin film can be further evened out in the second and later scanning. Thus, the uniformity of the thin film can be further improved.

Second Embodiment

Figure 6:
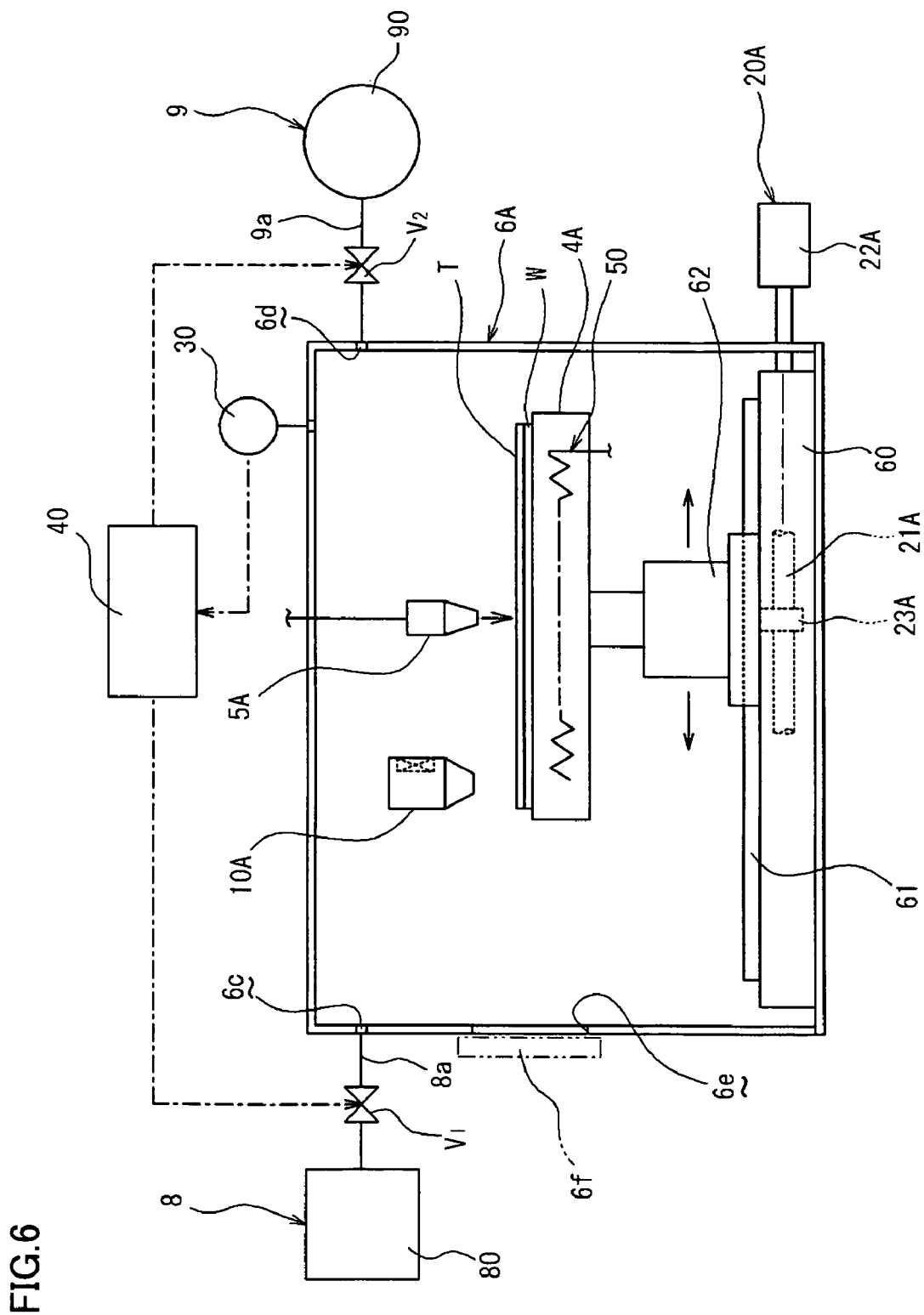
FIG. 6 is a schematic cross-sectional view of a film-forming device according to a Second Embodiment of the present invention.

FIG. 6 is a schematic cross-sectional view of a film-forming device according to a Second Embodiment of the present invention.

In the Second Embodiment, a coating unit and a film-forming unit are unified to a treatment chamber 6A, and both coating treatment and film-forming treatment are conducted in the treatment chamber 6A.

The film-forming device according to the Second Embodiment is provided with a treatment chamber 6A, spin chuck 4A, a coating-solution-supplying nozzle 5A, and a moving portion 20A. The treatment chamber 6A receives a wafer W so as to shield the wafer W from the air. The spin chuck 4A is disposed in the treatment chamber 6A and serves as a holding portion for horizontally and rotatably holding the wafer W. The coating-solution-supplying nozzle 5A supplies a coating solution to the wafer W held by the spin chuck 4A. The moving portion 20A relatively moves the spin chuck 4A and/or a solvent-gas-supplying nozzle 10A in directions parallel to each other. In these respects, the film-forming device according to the Second Embodiment is different from the device according to the First Embodiment, but other respects are the same. Therefore, the same reference numerals are used in the Second Embodiment to describe those components that are identical to the components of the First Embodiment without further description.

In the Second Embodiment, the treatment chamber 6A is provided with a conveying opening 6e at a side wall for taking a wafer W in and out. The conveying opening 6e is opened or closed by a shutter 6f driven by an ascending and descending mechanism (not shown). The solvent-gas-supplying nozzle 10A has a blower 15 mounted thereon and is fixed on the inside of the treatment chamber 6A.

The spin chuck 4A is disposed on a movable table 62 which is slidably fit to a guiding rail 61 mounted on a base table 60. The base table 60 is disposed on the bottom of the treatment chamber 6A. The spin chuck 4A is driven by a motor (not shown) and is horizontally rotated. The movable table 62 is connected to a ball screw axis 21A of a ball screw mechanism 20A via a slidable block 23A. The ball screw mechanism 20A is moving means and the ball screw axis 21A is disposed under the base table 60. The slidable block 23A is slidably fit to the ball screw axis 21A. Therefore, the movable table 62 and the spin chuck 4A are driven by a driving motor 22A of the ball screw mechanism 20A and are moved in a direction parallel to the fixed solvent-gas-supplying nozzle 10A.

Alternately, the spin chuck 4A is not moved and the solvent-gas-supplying nozzle 10A may be moved in a direction parallel to the spin chuck 4A, or both the solvent-gas-supplying nozzle 10A and the spin chuck 4A are moved in directions parallel to each other.

Figure 7:
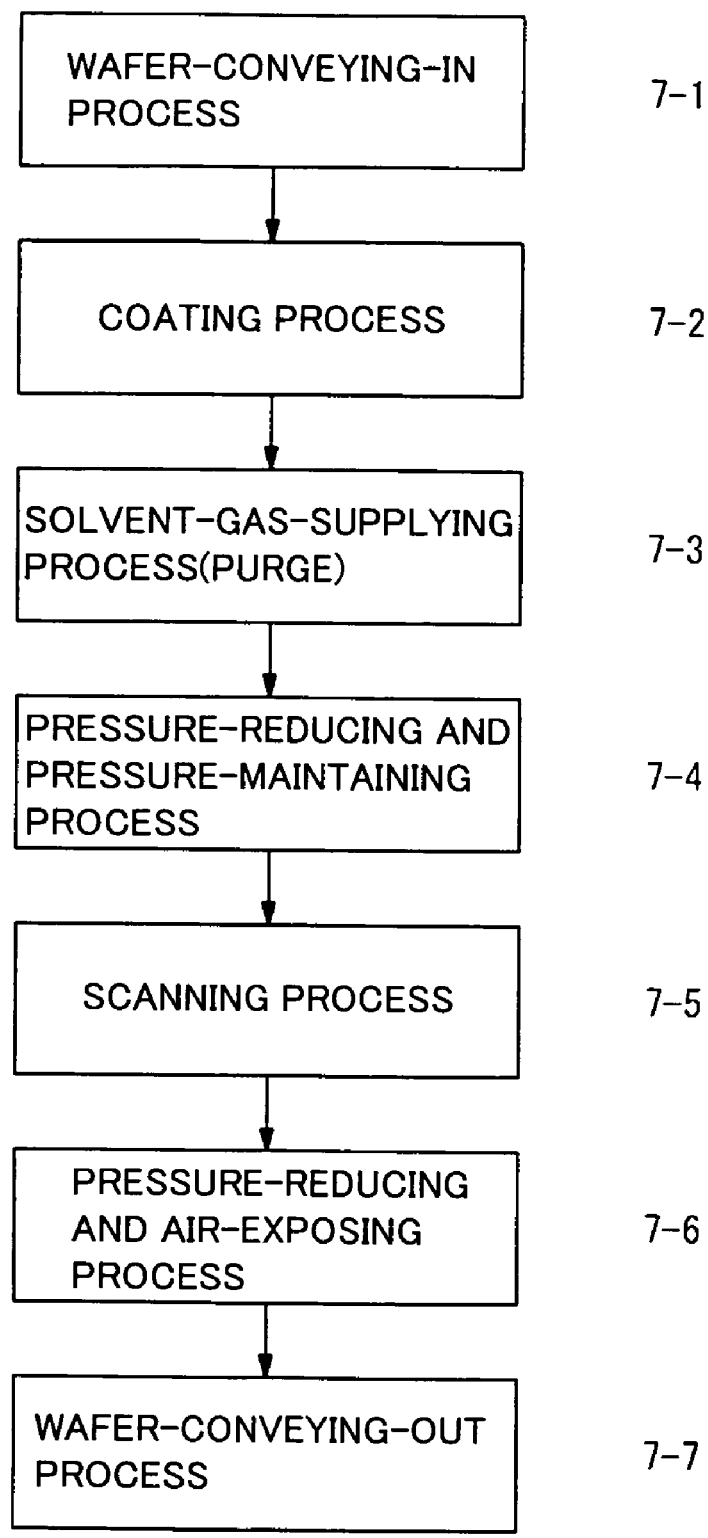
FIG. 7 is a flow chart showing the operation of the film-forming device according to the Second Embodiment of the present invention.

The operation of the film-forming device according to the Second Embodiment will now be described with reference to the drawing of FIG. 6 and the flow chart of FIG. 7.

A wafer W to be processed is held by a conveying arm (not shown) and is fed into the treatment chamber 6A through the conveying opening 6e by opening the shutter 6f Then, the wafer W is transferred to the spin chuck 4 (Step 7-1: Wafer-conveying-in process). The coating-solution-supplying nozzle 5A drops a coating solution onto the surface of the wafer W. The spin chuck 4A is rotated to form a thin film of the coating solution on the surface of the wafer W (Step 7-2: Coating process).

Then, the on-off valve V1 of the solvent-gas-supplying portion 8 is opened according to a control signal from the pressure controller 40 and, thereby, a solvent gas generated by the vaporizer 80 is supplied (purge) to the treatment chamber 6A (Step 7-3: Solvent-gas-supplying process). The pressure in the treatment chamber 6A, which is changed by the supply (purge) of the solvent gas, is detected by the pressure gauge 30. When the pressure in the treatment chamber 6A exceeds a predetermined level, the on-off valve V2 is opened by a predetermined opening degree according to a control signal from the pressure controller 40 to decrease pressure in the treatment chamber 6A. The pressure in the treatment chamber 6A is maintained at a level suitable for film-forming treatment, for example, at a pressure of 450 Pa when the treatment is conducted once, or at 400 Pa when the treatment is conducted twice (Step 7-4: Pressure-decreasing and Pressure-maintaining process). On this occasion, as mentioned above, the pressure in the treatment chamber 6A must be controlled to a level at least equal to or higher than the saturated vapor pressure level of a solvent, for example, a pressure of 350 Pa or more.

In a state that the inside of the treatment chamber 6A is in a solvent gas atmosphere at a predetermined pressure, the solvent-gas-supplying nozzle 10A and/or the wafer W held by the spin chuck 4A are relatively moved in directions parallel to each other. At the same time, as shown in FIGS. 3A and 3B, a solvent gas is sprayed from the solvent-gas-supplying nozzle 10A to the surface of the wafer W for planarizing the thin film T formed on the wafer W (Step 7-5: Scanning process). In this scanning process, the wafer W is moved with respect to the solvent-gas-supplying nozzle 10A from one end to the other end of the wafer W (1 time treatment), or the spin chuck 4A is reciprocatedly moved with respect to the solvent-gas-supplying nozzle 10A from one end to the other end of the wafer W and then back to the original position (2 times treatment).

The thin film on the surface of the wafer W is planarized in the scanning process, and then the on-off valve V1 is closed. The pressure in the treatment chamber 6A is decreased to, for example, 50 Pa by controlling the opening degree of the on-off valve V2 of the pressure-regulating portion 9, and then the treatment chamber 6A is exposed to the air (Step 7-6: Pressure-reducing and air-exposing process). Then, the supporting pins (not shown) provided to the spin chuck are 4A moved upward to lift the wafer W to the upper side of the spin chuck 4A. In this state, a conveying arm (not shown) receives the wafer W and takes the wafer W out (Step 7-7: Wafer-conveying-out process).

In the above-mentioned embodiments, an SOG solution is used as the coating solution, but the film-forming technology according to the present invention can be applied to a method using a coating solution other than the SOG solution, for example, a method using a resist, and can be further applied to a method for forming a film on a substrate other than the wafer, such as an LCD substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film-forming device for forming a thin film on a substrate having asperities on a surface thereof, the film-forming device comprising:
    a treatment chamber for receiving a substrate having a thin film of a coating solution formed thereon and shielding the substrate from the air;
    a holding portion for holding the substrate and being disposed in the treatment chamber;
    a solvent-gas-supplying portion for supplying a solvent gas into the treatment chamber;
    a blower for collecting the solvent gas supplied into the treatment chamber and transmitting the solvent gas to the solvent-gas-supplying nozzle, said blower being provided within the treatment chamber;
    a pressure-regulating portion for controlling pressure in the treatment chamber;
    a solvent-gas-supplying nozzle for spraying the solvent gas toward the surface of the substrate; and
    a moving portion for relatively moving the holding portion and/or the solvent-gas-supplying nozzle in directions parallel to each other.

2. The film-forming device according to claim 1, wherein the moving portion causes movement of the holding portion and/or the solvent-gas-supplying nozzle in directions parallel to each other one or more times;
    the solvent-gas-supplying nozzle is positioned relative to the substrate to establish a distance and is constituted so as to be able to change the distance from the substrate and to gradually increase the distance from the substrate two or more times.

3. The film-forming device according to claim 1 further comprising:
    a pressure gauge for detecting pressure in the treatment chamber; and
    a controlling portion for controlling the pressure-regulating portion according to a detection signal from the pressure gauge.

4. A film-forming device for forming a thin film on a substrate having asperities on a surface thereof by supplying a coating solution to the surface of the substrate, the film-forming device comprising:
    a rotating and holding portion for horizontally and rotatably holding a substrate;
    a coating-solution-supplying nozzle for supplying a coating solution to the substrate held by the rotating and holding portion;
    a treatment chamber for receiving the substrate having a thin film of a coating solution on the surface thereof and shielding the substrate from the air;
    a holding portion for holding the substrate and being disposed in the treatment chamber;
    a solvent-gas-supplying portion for supplying a solvent gas into the treatment chamber;
    a pressure-regulating portion for controlling pressure in the treatment chamber;
    a solvent-gas-supplying nozzle for spraying the solvent gas toward the surface of the substrate;
    a blower for collecting the solvent gas supplied into the treatment chamber and transmitting the solvent gas to the solvent-gas-supplying nozzle, said blower being provided within the treatment chamber; and
    a moving portion for relatively moving the holding portion and/or the solvent-gas-supplying nozzle in directions parallel to each other.

5. A film-forming device for forming a thin film on a substrate having asperities on a surface thereof by supplying a coating solution to the surface of the substrate, the film-forming device comprising:
    a treatment chamber for receiving a substrate and shielding the substrate from the air;
    a holding portion for horizontally and rotatably holding the substrate and being disposed in the treatment chamber;
    a coating-solution-supplying nozzle for supplying a coating solution to the substrate held by the holding portion;
    a solvent-gas-supplying portion for supplying a solvent gas into the treatment chamber; a pressure-regulating portion for controlling pressure in the treatment chamber;
    a solvent-gas-supplying nozzle for spraying the solvent gas toward the surface of the substrate;
    a blower for collecting the solvent gas supplied into the treatment chamber and transmitting the solvent gas to the solvent-gas-supplying nozzle, said blower being provided within the treatment chamber and
    a moving portion for relatively moving the holding portion and/or the solvent-gas-supplying nozzle in directions parallel to each other.

* * * * *